(12) United States Patent
Soni et al.

(10) Patent No.: US 11,366,460 B2
(45) Date of Patent: Jun. 21, 2022

(54) SYSTEM FOR MONITORING ELECTRICAL DEVICES AND A METHOD THEREOF

(71) Applicant: ECOLIBRIUM ENERGY PRIVATE LIMITED, Guarat (IN)

(72) Inventors: Chintan Soni, Gujarat (IN); Harit Soni, Gujarat (IN); Parthiv Patel, Gujarat (IN); Ravi Bhatia, Gujarat (IN); Aditya Bhandari, Rajasthan (IN); Ashutosh Sharma, Delhi (IN); Gokul G. Krishna, Tamil Nadu (IN); Gaurav Patwa, Up (IN); Parita Bhojani, Maharashtra (IN)

(73) Assignee: ECOLIBRIUM ENERGY PRIVATE LIMITED, Guarat (IN)

( * ) Notice: Subject to any disclaimer, the term of this patent is extended or adjusted under 35 U.S.C. 154(b) by 147 days.

(21) Appl. No.: 16/473,049

(22) PCT Filed: Sep. 7, 2017

(86) PCT No.: PCT/IN2017/050387
§ 371 (c)(1),
(2) Date: Jun. 24, 2019

(87) PCT Pub. No.: WO2018/116315
PCT Pub. Date: Jun. 28, 2018

(65) Prior Publication Data
US 2019/0346835 A1    Nov. 14, 2019

(30) Foreign Application Priority Data

Dec. 23, 2016    (IN) .............................. 201621044152

(51) Int. Cl.
G05B 23/02        (2006.01)
G01R 19/25        (2006.01)
(Continued)

(52) U.S. Cl.
CPC ..... G05B 23/0221 (2013.01); G01R 19/2513 (2013.01); G05B 19/408 (2013.01); H04W 4/70 (2018.02)

(58) Field of Classification Search
CPC .............. G05B 23/0221; G05B 19/408; G01R 19/2513
(Continued)

(56) References Cited

U.S. PATENT DOCUMENTS 8,321,163 B2    11/2012    Ewing et al.
2004/0078171 A1    4/2004    Wegerich et al.
(Continued)

OTHER PUBLICATIONS

The Free dictionary, Electric drive—article about Electric Drive by the Free dictionary (Year: 2003).*

(Continued)

*Primary Examiner* — Michael P Nghiem
*Assistant Examiner* — Dacthang P Ngo
(74) *Attorney, Agent, or Firm* — Locke Lord LLP; Tim Tingkang Xia, Esq.

(57) ABSTRACT

A system for monitoring an electrical device and a method thereof is provided, wherein at least one primary unit is connected with an input side and/or an output side of the electrical device and configured to obtain electrical parameters of the electrical device. A secondary unit is connected with each primary unit and configured to receive the electrical parameters obtained by the primary unit, store the electrical parameters to form a repository of previously obtained electrical parameters, compare the electrical parameters with previously obtained electrical parameters to determine any deviation in the electrical parameters and correlate the deviation in electrical parameters with a list of impending faults to identify any impending fault. The secondary unit based upon the correlation of the electrical (Continued)

parameters generates a summary and/or alert indicative of state of the electrical device by way of alerts, notifications etc.

14 Claims, 5 Drawing Sheets

(51) Int. Cl.
*G05B 19/408* (2006.01)
*H04W 4/70* (2018.01)

(58) Field of Classification Search
USPC .......................................................... 702/183
See application file for complete search history.

(56) References Cited

U.S. PATENT DOCUMENTS

| | | | | |
|---|---|---|---|---|
| 2008/0106426 A1* | 5/2008 | Deaver | ................... | G06Q 50/06 |
| | | | | 340/657 |
| 2013/0250845 A1* | 9/2013 | Greene | ................... | G08C 17/02 |
| | | | | 370/315 |
| 2014/0244192 A1* | 8/2014 | Craig | ..................... | G01R 21/06 |
| | | | | 702/62 |
| 2017/0336444 A1* | 11/2017 | Sela | ......................... | H02H 7/22 |

OTHER PUBLICATIONS

United State Patent and Trademark Office (ISR/US), "International Search Report for PCT/US2017/050387", US, dated Jun. 6, 2018.

\* cited by examiner

SYSTEM FOR MONITORING ELECTRICAL DEVICES AND A METHOD THEREOF

FIELD OF THE INVENTION

The invention relates to monitoring of electrical devices.

BACKGROUND OF THE INVENTION

Electrical devices are generally used continuously for a prolonged period of time, and undergo wear and tear due to various reasons and consequently breakdown. In particular, break down of electrical devices such as motors or transformers which form an integral part of a facility or industrial process/setup may lead to shutdown of the facility or industrial process/setup, thereby hampering the productivity of the facility or industrial process/setup, in which the electrical device is deployed. Motors, as known are subjected to frequent overloading, vibration, noise, etc whereby allied faults develop in the motor due to repeated loading conditions/cycles. As a result, the motor is frequently prone to damage or breakdown on account of such conditions. Further, transformers are subjected to extreme outdoor conditions which affects working of the transformer and/or reduces life of the transformer.

Occurrence of such conditions is undesirable and cause inconvenience as well as losses to industrial units. Accordingly, continuous monitoring of health/performance of electrical device is essential. The prevailing methods and systems monitor health and detect faults in the electrical device based on various electrical and physical parameters like vibration, temperature, acoustics, etc. captured at high sampling rate for analysis. In this regard, various sensors and devices are used to measure the electrical and physical parameters and other faults developed in the electrical device, which make the existing systems/methods complex. The sensors need to be calibrated often to ensure their optimum performance to be able to provide with accurate readings. Moreover, the cost of these solutions makes their implementation in industrial setups impractical.

Further, relays and protection devices are generally used to prevent complete breakdown of the electrical device. While, relay and protection devices may prevent complete breakdown, the same does not provide any indication or information to carry out preventive maintenance of an impending fault condition. Accordingly, there is a need to have such a system and a method to monitor health and detect faults of an electrical device continuously in a cost-effective/affordable basis.

SUMMARY OF THE INVENTION

Accordingly, the present invention in one aspect provides a system for monitoring an electrical device, the system comprising at-least one primary unit connected with the electrical device, the primary unit configured to obtain electrical parameters of the electrical device at pre-defined time intervals, a secondary unit connected with each primary unit, the secondary unit configured to receive the electrical parameters obtained by each primary unit, store the electrical parameters to form a repository of previously obtained electrical parameters, compare the electrical parameters with previously obtained electrical parameters to determine any deviation in the electrical parameters, correlate the deviation in electrical parameters with a list of impending faults to identify any impending fault, and generate a summary and/or an alert indicative of state of the electrical device based upon the correlation of the electrical parameters.

In another aspect the present invention provides method for monitoring an electrical device, the method comprising the steps of obtaining electrical parameters of the electrical device by a primary unit at pre-defined time intervals, receiving at a secondary unit the electrical parameters obtained by the primary unit, storing the electrical parameters to form a repository of previously obtained electrical parameters, comparing the electrical parameters with previously obtained electrical parameters to determine any deviation in the electrical parameters, correlating the deviation in electrical parameters with a list of impending faults to identify any impending fault, and generating a summary and/or an alert indicative of state of the electrical devices based upon the correlation of the electrical parameters.

BRIEF DESCRIPTION OF THE DRAWINGS

Reference will be made to embodiments of the invention, examples of which may be illustrated in accompanying figures. These figures are intended to be illustrative, not limiting. Although the invention is generally described in context of these embodiments, it should be understood that it is not intended to limit the scope of the invention to these particular embodiments.

DETAILED DESCRIPTION OF THE INVENTION

The present invention is directed towards monitoring an electrical device to diagnose/detect impending faults and remaining operating life of the electrical device. The present invention is further directed to indicate or generate alerts regarding such impending faults locally or remotely on an electronic device so as to alert a user.

Figure 1:
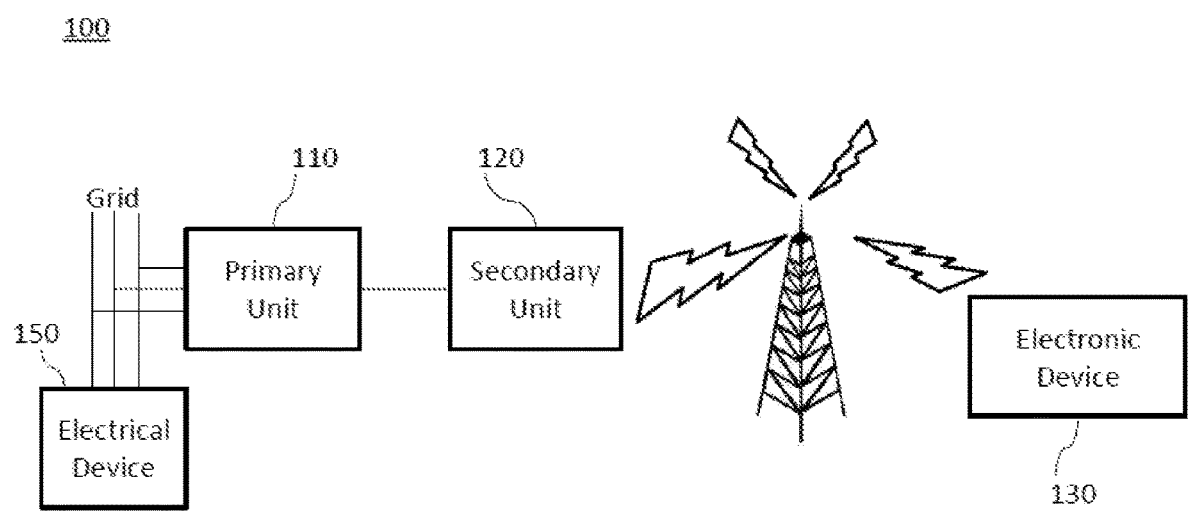
FIG. 1 shows a block diagram of a system for monitoring an electrical device in accordance with an embodiment of the invention.

FIG. 1 shows a system 100 for monitoring an electrical device 150 in accordance with an embodiment of the invention. The system comprises a primary unit 110, a secondary unit 120, and an electronic device 130.

As shown in FIG. 1, the electrical device is connected with one primary unit. In an embodiment of the invention, the electrical device is a motor. The primary unit can be connected with an input-side or an output side of the electrical device for obtaining electrical parameters of the electrical device at pre-defined time intervals. Preferably, the primary unit is connected on the input side of the motor/electrical device. In an embodiment, the primary unit could be any of the following but not limited to an electrical meter, electrical drive, third party database configured for obtaining electrical parameters over varying load and including but not limited to current, voltage and power factor. The primary unit is configured to obtain RMS values of the electrical parameters. Alternately, instantaneous values of the electrical parameters may be obtained The secondary unit is in communication with the primary unit. In an embodiment, the secondary unit is configured to receive the electrical parameters obtained by the primary unit, store the electrical parameters to form a repository of previously obtained electrical parameters, compare the electrical parameters with previously obtained electrical parameters to determine any deviation in the electrical parameters, correlate the deviation in electrical parameters with a list of impending faults to identify any impending fault, and generate a summary indicative of state of the electrical devices based upon the correlation of the electrical parameters.

Figure 4:
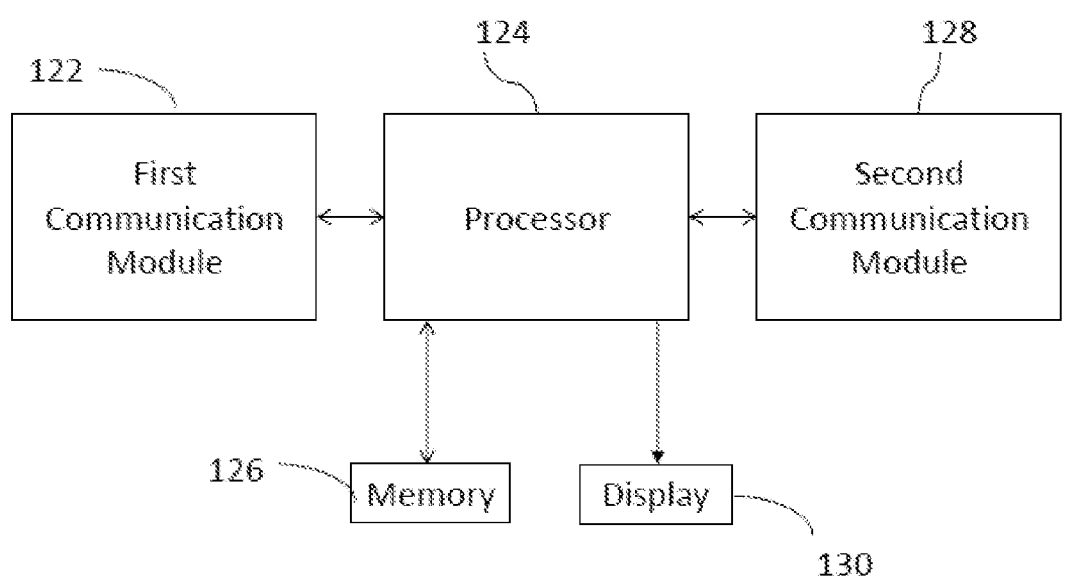
FIG. 4 shows a block diagram of a secondary unit of the system in accordance with an embodiment of the invention.

The secondary unit as shown in FIG. 4 comprises of a first communication module 122, a processor 124, a memory 126, a second communication module 128 and a display 130. The first communication module is a wired communication module and allows the secondary unit to connect with each of the primary unit via any of the following but not limited to RS-485, RS-232, optical port, and RJ-11. Alternately, the first communication module can be a wireless communication module enabling wireless communication with the primary unit. The processor is a data collection, processing and alert unit (DCPAU) which interacts with each primary unit to receive electrical parameters of the electrical device obtained by the primary unit at configurable time intervals through the first communication module. In this regard, the processor also obtains the unique ID of the respective primary unit so as to identify and collate electrical parameters obtained by each of the primary unit.

The processor receives the electrical parameters obtained by the primary unit, store the electrical parameters to form a repository of previously obtained electrical parameters in the memory, compare the electrical parameters with previously obtained electrical parameters to determine any deviation in the electrical parameters, correlate the deviation in electrical parameters with a list of impending faults to identify any impending fault, and generate a summary indicative of state of the electrical devices based upon the correlation of the electrical parameters. In this regard the processor is configured to process/analyse the electrical parameters and obtain derived parameters, wherein the derived parameters are mathematically transformed electrical parameters. The parameters or the derived parameters are indicative of the inherent characteristic of the electrical device. Accordingly, from the parameters obtained/processed, characteristics of the electrical device can be identified. The derived parameters are saved in the memory, and as the system continues to obtain electrical parameters over pre-determined time periods the new derived parameters are compared with stored derived electrical parameters to determine deviations. These deviations are tracked over time, and any aberration or anomaly observed indicate or imply that the characteristics of the device or motor or system have changed over passage of time. The characteristic patterns in aberrations or anomaly are correlated with specific impending fault or event in the system or device under monitoring. Further, device learning model at work also updates itself with time, user intervention, state change, etc. The processor is further capable of sending out alerts and notifications through the display of the secondary unit. The display can also be an interactive touch-screen display.

The second communication module is a wired and/or wireless communication module and allows the secondary unit to connect with the electronic device via any of the following but not limiting to WAN/LAN, GPRS/EDGE, UMTS, LTE, Wi-Fi, and ZigBee. The electronic device can be selected from smart phones, laptops, Tablet PC, etc. The electronic device is installed with a web-based interface or an application to interact with the secondary unit. In this regard, results of the analysis are provided on the web-based interface or the application installed on the electronic device. The result of the analysis includes summary of the behavior of the device, alerts when there is gradual or sudden deviation in the parameters measured or derived, recommendations and insights for overcoming any abnormalities or deviations detected. Alternately, the result of the analysis can be provided via messaging such as electronic mail, short messaging service, smart phone notification, etc.

Figure 2:
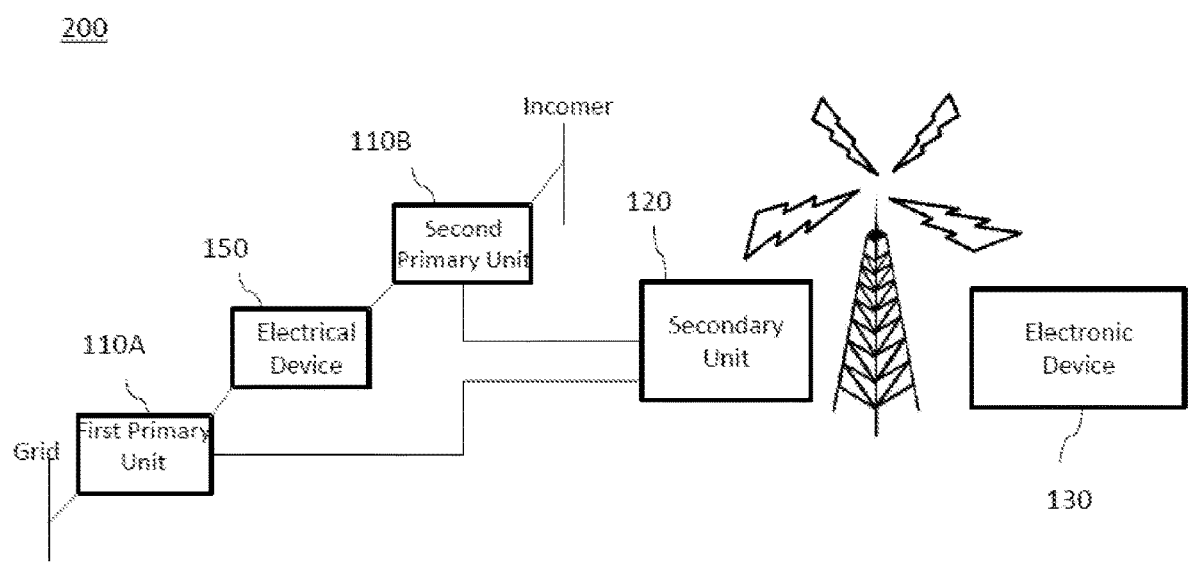
FIG. 2 shows a block diagram of a system for monitoring an electrical device in accordance with an embodiment of the invention.

FIG. 2 shows a system 200 for monitoring an electrical device in accordance with an embodiment of the invention. The system comprises two primary units—a first primary unit 110A and a second primary unit 110B, a secondary unit 120, and an electronic device 130.

As shown in FIG. 2, the electrical device is connected with two primary units—first primary unit is connected with an input-side of the electrical device and second primary unit is with an output side of the electrical device. In an embodiment of the invention, the electrical device is a transformer. As is known in the art, a transformer changes/transforms voltage level of electric energy, the transformer has electrical parameters on its input side and output side. Accordingly, it is preferable to provide one primary unit on the input side and one primary unit on the output side of the transformer. Each of the primary unit is configured to obtain electrical parameters of the electrical device. In an embodiment, the primary unit could be any of the following but not limited to an electrical meter, electrical drive, third party database configured for obtaining electrical parameters over varying load and including but not limited to current, voltage and power factor. Each primary unit is configured to obtain RMS values of the electrical parameters. Alternately, instantaneous values of the electrical parameters may be obtained. The first primary unit obtains electrical parameters from the input-side of the electrical device, and the second primary unit obtains electrical parameters from the output-side of the electrical device. The secondary unit is in communication with the first primary unit and the second primary unit, and receives electrical parameters of the input-side of the electrical device and the output-side of the electrical device. The electrical parameters obtained by the primary units i.e. electrical parameters of the input-side of the electrical device and the output-side of the electrical device can be individually processed by the primary unit or the electrical parameters can be combined/merged and processed thereafter by the secondary unit. The secondary unit is similar to the secondary unit illustrated in FIG. 1 and processes the electrical parameters as discussed hereinbefore.

Figure 3:
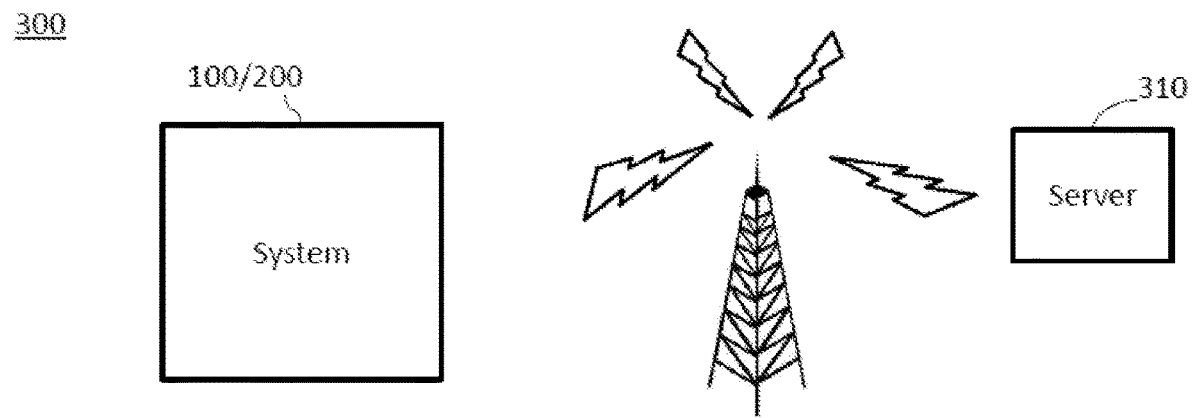
FIG. 3 shows a block diagram of a system for monitoring an electrical device in accordance with an embodiment of the invention.

FIG. 3 shows a system 300 for monitoring electrical devices in accordance with an embodiment of the invention, wherein the system 100 or 200 shown in FIGS. 1 and 2, further comprises a server 310. In this regard, the data acquired by the primary units and the secondary unit are transferred to the server 310, and the analysis is carried out by the secondary unit is transferred to the server. Alternately, the analysis can also be carried out by the server. In an embodiment of the invention, the server can be a cloud server or an on-premise server and all the analysis related data is stored on the server. The electronic device shown in FIGS. 1 and 2 is in communication with the server and the results of the analysis are provided on the web-based interface or the application installed electronic device. As discussed hereinbefore, result of the analysis is provided on the web-based interface or the application installed on the electronic device. The result of the analysis includes summary of the behavior of the device, alerts when there is gradual or sudden deviation in the parameters measured or derived, recommendations and insights for overcoming any abnormalities or deviations detected. Alternately, the result of the analysis can be provided via messaging such as electronic mail, short messaging service, smart phone notification, etc. In an embodiment of the invention, the result of said analysis can also be communicated back to secondary unit for display on the local user display.

In an embodiment of the invention, the communication links between the primary units, the secondary unit, the server, and the electronic devices are encrypted communication links.

Further, the system is capable of monitoring multiple electrical devices. In such a configuration, each primary unit is associated with a unique ID. The unique ID enables identification of the primary unit and/or the electrical device being monitored. The secondary unit is capable of communicating with multiple primary units via varying protocols. In this regard, the secondary unit connected with multiple primary units identifies and communicates with the primary units based upon the unique ID of the primary units.

Figure 5:
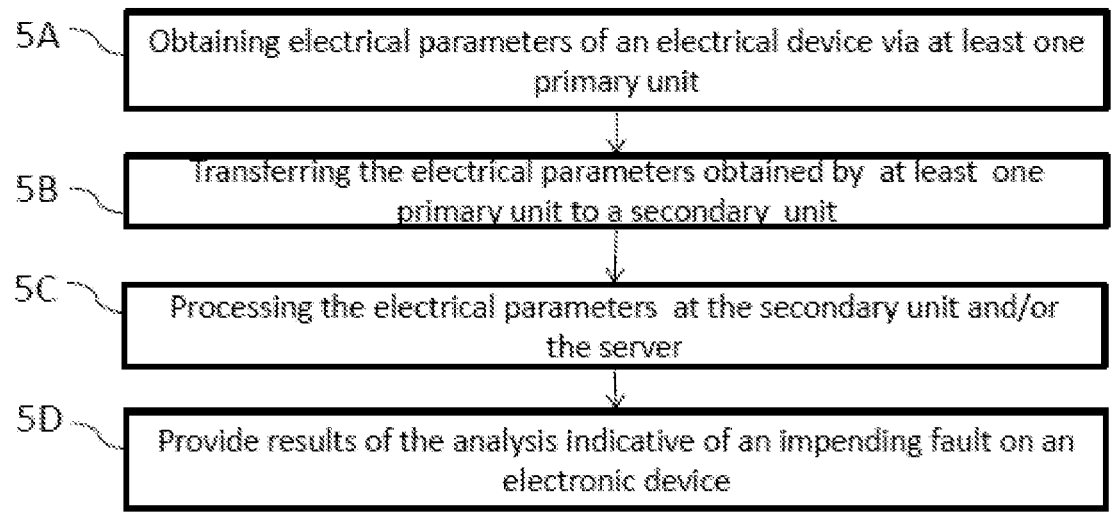
FIG. 5 shows a method for monitoring an electrical device in accordance with an embodiment of the invention.

FIG. 5 shows a flowchart of a method for monitoring an electrical device in accordance with an embodiment of the invention. In order to implement such a method, the invention is used or integrated with a system shown in FIG. 1 or 2.

The method begins at step 5A, where electrical parameters of an electrical device is obtained via one or more primary units at pre-defined time intervals, wherein at-least one primary unit is connected with an input-side of the electrical device and/or at-least one primary unit is connected with an output side of the electrical device. The primary unit can be an electrical meter, electrical drive, third party database connected to each of the electrical device.

At step 5B, the electrical parameters obtained by each of the primary unit are transferred to a secondary unit. The secondary unit comprises a first communication module, a processor, a memory and a second communication module. The first communication module is a wired communication module which allows the secondary unit to connect with each of the primary unit via any of but not limited to RS-485, RS-232, optical port, RJ-11. Alternately, the first communication module can be a wireless communication module enabling wireless communication with the electrical devices. The processor is configured to interact with each primary unit to obtain/receive electrical parameters of the electrical device through the first communication module. The second communication module is a wireless communication module which allows the secondary unit to connect with a server and/or an electronic device via any of LAN/WAN, GPRS/EDGE, UMTS, LTE, Wi-Fi, and ZigBee. Alternately, the second communication module can be a wired communication module.

As shown in FIG. 5, at step 5C the electrical parameters obtained at the secondary unit are processed/analyzed by the secondary unit and/or a server. The processor receives the electrical parameters obtained by the primary unit, store the electrical parameters to form a repository of previously obtained electrical parameters, compare the electrical parameters with previously obtained electrical parameters to determine any deviation in the electrical parameters, correlate the deviation in electrical parameters with a list of impending faults to identify any impending fault, and generate a summary indicative of state of the electrical devices based upon the correlation of the electrical parameters. In this regard, the electrical parameters are processed/analyzed to obtain derived parameters, wherein the derived parameters are mathematically transformed electrical parameters. The parameters or the derived parameters are indicative of the inherent characteristic of the electrical device. Accordingly, from the parameters obtained/processed, characteristics of the electrical device can be identified. The derived parameters are saved, and as the method continues to obtain electrical parameters over pre-determined time periods, the new derived parameters are compared with the stored derived electrical parameters to determine deviations. These deviations are tracked over time, and any aberration or anomaly observed indicate or imply that the characteristics of the device or motor or transformer or system have changed over passage of time. The characteristic patterns in aberrations or anomaly are correlated with specific impending fault or event in the system or device under monitoring. Further, as per the invention, the device learning model at work also updates itself with time, user intervention, state change, etc.

At step 5D, results of the analysis obtained at step 5C are provided to the electronic device. The electronic device can be selected from smart phones, laptops, Tablet PC, etc. The electronic device is installed with a web-based interface or an application to interact with the secondary unit. In this regard, result of the analysis are provided on the web-based interface or the application installed on the electronic device. The result of the analysis includes summary of the behavior of the device, alerts when there is gradual or sudden deviation in the parameters measured or derived, recommendations and insights for overcoming any abnormalities or deviations detected. Alternately, the result of the analysis can be provided via messaging such as electronic mail, short messaging service, smart phone notifications, etc.

Advantageously, the present invention provides a system and method which provides timely feedback regarding impending faults by continuous monitoring of the electrical device or motor or transformer or system. Further, the invention obviates the use of multiple sensors by connecting a meter to the electrical device, and hence is less complex, and also reduces costs.

While the present invention has been described with respect to certain embodiments, it will be apparent to those skilled in the art that various changes and modification may be made without departing from the scope of the invention as defined in the following claims.

We claim:

1. A system for monitoring an electrical device, the system comprising:
    at-least one primary unit connected with the electrical device, the at-least one primary unit configured to obtain electrical parameters of the electrical device at pre-defined time intervals; and
    a secondary unit connected with each of the at-least one primary unit comprising a processor, and a memory, the secondary unit configured to:
        receive, by the processor, the electrical parameters obtained by each of the at-least one primary unit;
        store, by the processor, the electrical parameters to form a repository of previously obtained electrical parameters in the memory;
        compare, by the processor, the electrical parameters with previously obtained electrical parameters to determine any deviation in the electrical parameters;
        correlate, by the processor, the deviation in the electrical parameters with a list of impending faults to identify any impending fault; and generate, by the processor, a summary and/or an alert indicative of state of the electrical device based upon the correlation of the electrical parameters, wherein said receiving the electrical parameters obtained by each of the at-least one primary unit also includes obtaining, by the processor, an unique ID of the respective primary unit so as to identify and collate the electrical parameters obtained by each of the of the at-least one primary unit, wherein an electronic device is installed with a web-based interface or an application to interact with the secondary unit.

2. The system as claimed in claim 1, wherein the at-least one primary unit is connected with an input-side of the electrical device and/or the at-least one primary unit is connected with an output side of the electrical device.

3. The system as claimed in claim 1, wherein the electrical device is a motor, wherein the at-least one primary unit is connected with an input side of the motor.

4. The system as claimed in claim 1, wherein the electrical device is a transformer, wherein the at-least one primary unit comprises a first primary unit connected to an input side of the transformer, and a second primary unit connected to an output side of the transformer.

5. The system as claimed in claim 1, wherein the at-least one primary unit is configured to obtain RMS or instantaneous values of the electrical parameters.

6. The system as claimed in claim 1, wherein the at-least one primary unit comprises an electric meter.

7. The system as claimed in claim 1, wherein the secondary unit further comprises a first communication module enabling connectivity of the secondary unit with the at-least one primary unit, and a second communication module for enabling connectivity of the secondary unit with electronic devices and/or a server.

8. The system as claimed in claim 7, wherein the first communication module and the second communication module are selected from a wired communication module or a wireless communication module.

9. The system as claimed in claim 1 further comprising a server.

10. The system as claimed in claim 7, wherein the processor is configured to obtain derived parameters from the electrical parameters, the derived parameters being mathematically transformed electrical parameters.

11. A method for monitoring an electrical device, the method comprising the steps of:
obtaining electrical parameters of the electrical device by a primary unit at pre-defined time intervals;
receiving, by a processor of a secondary unit, the electrical parameters obtained by the primary unit;
storing, by the processor, the electrical parameters to form a repository of previously obtained electrical parameters in a memory of the secondary unit;
comparing, by the processor, the electrical parameters with previously obtained electrical parameters to determine any deviation in the electrical parameters;

correlating, by the processor, the deviation in the electrical parameters with a list of impending faults to identify any impending fault; and
generating, by the processor, a summary and/or an alert indicative of state of the electrical devices based upon the correlation of the electrical parameters.

wherein said receiving the electrical parameters obtained by the primary unit also includes obtaining, by the processor, an unique ID of the primary unit so as to identify and collate the electrical parameters obtained by each primary unit, wherein an electronic device is installed with a web-based interface or an application to interact with the secondary unit.

12. The method as claimed in claim 11, wherein the electrical parameters obtained are RMS or instantaneous values of the electrical parameters.

13. The method as claimed in claim 11, further comprising the step of obtaining derived parameters from the electrical parameters, the derived parameters being mathematically transformed electrical parameters.

14. A system for monitoring an electrical device, the system comprising:
at-least one primary unit connected with the electrical device, the at-least one primary unit configured to obtain electrical parameters of the electrical device at pre-defined time intervals; and
a secondary unit connected with each of the at-least one primary unit comprising a processor, and a memory, the secondary unit configured to:
receive, by the processor, the electrical parameters obtained by each of the at-least one primary unit;
store, by the processor, the electrical parameters to form a repository of previously obtained electrical parameters in the memory;
compare, by the processor, the electrical parameters with a series of previously obtained electrical parameters to determine any deviation in the electrical parameters;
track, by the processor, the deviations over a period of time;
correlate, by the processor, the deviations of the electrical parameters over the period of time with a list of impending faults to predict any impending fault; and
generate, by the processor, a summary and/or an alert predictive of a future state of the electrical device based upon the correlation of the deviations of electrical parameters, wherein said receiving the electrical parameters obtained by each of the at-least one primary unit also includes obtaining, by the processor, an unique ID of the respective primary unit so as to identify and collate the electrical parameters obtained by each of the of the at-least one primary unit, wherein an electronic device is installed with a web-based interface or an application to interact with the secondary unit.

* * * * *